United States Patent
Kawaguchi et al.

(10) Patent No.: US 10,497,546 B2
(45) Date of Patent: Dec. 3, 2019

(54) INSULATING STRUCTURE

(71) Applicant: SUMITOMO HEAVY INDUSTRIES ION TECHNOLOGY CO., LTD., Tokyo (JP)

(72) Inventors: Hiroshi Kawaguchi, Ehime (JP); Yuuji Ishida, Ehime (JP)

(73) Assignee: SUMITOMO HEAVY INDUSTRIES ION TECHNOLOGY CO., LTD., Tokyo (JP)

(*) Notice: Subject to any disclaimer, the term of this patent is extended or adjusted under 35 U.S.C. 154(b) by 0 days.

(21) Appl. No.: 15/918,656

(22) Filed: Mar. 12, 2018

(65) Prior Publication Data

US 2018/0261434 A1 Sep. 13, 2018

(30) Foreign Application Priority Data

Mar. 8, 2017 (JP) .................................. 2017-043978

(51) Int. Cl.
| | |
|---|---|
| *H01J 37/00* | (2006.01) |
| *H01J 37/32* | (2006.01) |
| *C23C 14/48* | (2006.01) |
| *H01J 37/317* | (2006.01) |

(52) U.S. Cl.
CPC ........ *H01J 37/32559* (2013.01); *C23C 14/48* (2013.01); *H01J 37/3171* (2013.01); *H01J 37/32366* (2013.01); *H01J 2237/038* (2013.01)

(58) Field of Classification Search
CPC .......... H01J 37/32559; H01J 37/32366; H01J 37/3171; H01J 2237/038; C23C 14/48

USPC .............. 250/492.1–492.3, 423 R, 424, 426; 313/256, 259, 268, 289
See application file for complete search history.

(56) References Cited

U.S. PATENT DOCUMENTS

| | | | | |
|---|---|---|---|---|
| 5,262,652 A | * | 11/1993 | Bright | H01J 27/022 250/423 R |
| 7,315,034 B2 | | 1/2008 | Yagita et al. | |
| 9,281,160 B2 | * | 3/2016 | Sato | H01J 27/024 |
| 9,336,992 B2 | | 5/2016 | Amano | |
| 2005/0151089 A1 | * | 7/2005 | Bong | H01J 37/08 250/396 R |

(Continued)

FOREIGN PATENT DOCUMENTS

| | | |
|---|---|---|
| JP | H02-072544 A | 3/1990 |
| JP | H09-022675 A | 1/1997 |
| JP | 2837023 B2 | 12/1998 |

(Continued)

*Primary Examiner* — Michael Maskell
(74) *Attorney, Agent, or Firm* — Michael Best & Friedrich LLP

(57) ABSTRACT

In an insulating structure which insulates an electrode provided inside a vacuum region of an ion implanter from another member and supports the electrode, a first insulating member supports the electrode. A second insulating member is fitted to the first insulating member to suppress deposition of contamination particles to the first insulating member. The second insulating member is formed of a material having a hardness lower than that of the first insulating member. A Vickers hardness of an outer surface of the second insulating member is 5 GPa or less. Bending strength of the second insulating member is 100 MPa or less. The second insulating member is formed of a material including at least one of boron nitride, a porous ceramic, and a resin.

16 Claims, 7 Drawing Sheets

(56) References Cited

U.S. PATENT DOCUMENTS

2014/0353518 A1* 12/2014 Sato .................. H01J 27/024
250/424

FOREIGN PATENT DOCUMENTS

| JP | 2000-331620 A | 11/2000 |
|----|---------------|---------|
| JP | 2006-156184 A | 6/2006 |
| JP | 2014-235814 A | 12/2014 |
| JP | 2016-009551 A | 1/2016 |

* cited by examiner

INSULATING STRUCTURE

RELATED APPLICATIONS

Priority is claimed to Japanese Patent Application No. 2017-043978, filed Mar. 8, 2017, the entire content of which is incorporated herein by reference.

BACKGROUND

Technical Field

Certain embodiment relates to an insulating structure appropriate to an electrode provided in an ion implanter.

Description of Related Art

An ion implanter includes several electrodes such as an extraction electrode system for extracting an ion beam from an ion source and the electrodes are supported via other electrodes or a surrounding structure by an insulator. For example, in a related art, an ion source is described, which includes a needle-shaped electrode and an extraction electrode and applies a high voltage between the needle-shaped electrode and the extraction electrode to generate an ion beam.

SUMMARY

According to an aspect of the present invention, there is provided an insulating structure which insulates an electrode provided inside a vacuum region of an ion implanter from another member and supports the electrode. The insulating structure includes a first insulating member which supports the electrode and a second insulating member which is fitted to the first insulating member to suppress deposition of contamination particles on the first insulating member. The second insulating member is formed of a material having a hardness lower than that of the first insulating member.

DETAILED DESCRIPTION

Figure 1:
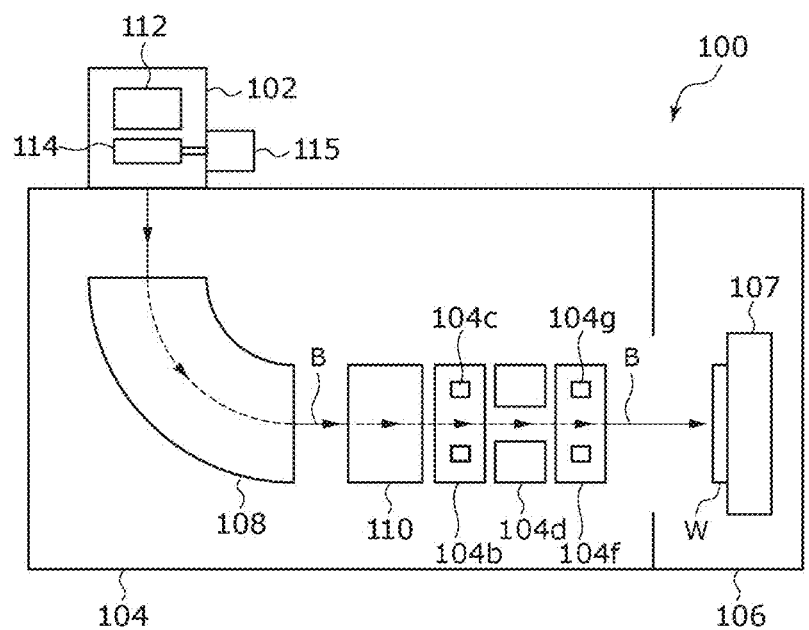
FIG. 1 is a view schematically showing an ion implanter including an insulating structure according to an embodiment of the present invention.

The present inventor has obtained the following recognition concerning an insulating structure of an electrode provided in an ion implanter. Preferably, the insulating structure of the electrode includes an insulator capable of securing insulation performance between the electrode and another member while supporting the electrode with a desired strength. In the ion implanter, depending on a material for an ion beam or a configuration of an ion source, it is considered that conductive contamination particles are extracted together with the ion beam and deposited on a surface of the insulator of the extraction electrode system. If the contamination particles are deposited, a conductive path is formed on the surface of the insulator and insulation performance deteriorates. The deterioration in insulation performance may impair a normal operation of the ion implanter. In a case where a large amount of contamination particles are generated, frequent maintenance of the insulating structure is required, and thus, an operation availability of the ion implanter deteriorates. The above-described problems are not limited to the insulating structure of the extraction electrode system, but may occur in insulating structures of other types of electrodes provided in the ion implanter. From these considerations, the present inventor has found that there is a room for improvement on the insulating structure of the electrode provided in the ion implanter from the viewpoint of suppressing deterioration in insulation performance caused by the deposition of contamination particles while maintaining supporting strength of the electrode.

It is desirable to provide an insulating structure capable of suppressing deterioration in insulation performance caused by the deposition of contamination particles while maintaining supporting strength of the electrode.

According to an embodiment of the present invention, there is provided an insulating structure which insulates an electrode provided inside a vacuum region of an ion implanter from another member and supports the electrode. The insulating structure includes a first insulating member which supports the electrode and a second insulating member which is fitted to the first insulating member to suppress the deposition of contamination particles on the first insulating member. In the insulating structure, a second insulating member is fitted to the first insulating member, and thus, it is possible to suppress the deposition of contamination particles to a first insulating member.

According to the embodiment of the present invention, it is possible to provide an insulating structure capable of suppressing deterioration in insulation performance caused by the deposition of contamination particles while maintaining supporting strength of the electrode.

The present inventor considers the insulating structure of the electrode provided inside the ion implanter and obtains the following recognition. In the ion implanter, a plurality of electrodes are provided in each of an extraction electrode system for extracting ions, a lens electrode system for parallelizing an extracted ion beam, a deflecting electrode system for deflecting the ion beam, and the like. In general, the electrodes are provided on or near a traveling path of the ion beam in the ion implanter. For example, a high voltage of 0.5 kV to 5 kV (or more) is applied to each of the electrodes, and thus, the electrode is supported in a state of being insulated from another electrode or the surrounding structure by an insulator. A high voltage which is higher than a voltage applied to the electrode of the extraction electrode system may be applied to the electrode of each of the lens electrode system, an acceleration/deceleration electrode system, the deflecting electrode system, and the like. In the ion implanter, when the ion beam extracted, contamination particles having conductivity may be also extracted.

Particularly, if a corrosive or reactive gas such as $BF_3$ is used as an ion source gas, the corrosive or reactive gas reacts with a carbon material of an inner wall of an arc chamber or the carbon material of an extraction electrode section (suppression electrode, ground electrode, supporting member of each electrode, or the like), and thus, the contamination particles are easy to deposit. If the contamination particles are deposited on a surface of the insulator which insulates the ground electrode and the suppression electrode, a conductive path is formed on the surface of the insulator, insulation performance deteriorates, and a current leaking from the ground electrode to the suppression electrode increases. If the leakage current increases, there is concern that a normal operation of the ion implanter is hindered, and thus, in a case where the leakage current exceeds a predetermined value, maintenance of the electrodes is performed. In order to decrease frequency of the maintenance, a configuration is considered, in which an insulator is formed of a material having low strength to suppress the formation of the conductive path generated by the deposition. However, in the case, there is concern that sufficient mechanical strength to support the electrode cannot be obtained. Accordingly, the present inventor recognizes that a deterioration in the insulation performance caused by the deposition of the contamination particles increases the frequency of the maintenance of the ion implanter, which causes an operation availability of the ion implanter to decrease.

Therefore, the present inventor proposes a configuration in which an insulator having high strength is fitted by another insulator formed of a brittle material having a low hardness in order to decrease the deposition of the contamination particles to the insulators which insulate the electrode while maintaining support strength of the electrode. By decreasing the mechanical strength of the other insulator, if a minute discharge occurs in a case where the contamination particles are deposited on the other insulator, a minute deformation or damage is applied to the surface of the other insulator due to impact caused by the minute discharge, and thus, the contamination particles can be removed together with some materials of the other insulator. That is, it is expected that a self-removal function of the contamination particles is exerted by adding the insulator. The embodiment is devised based on the above-described thinking and a concrete configuration thereof will be explained below.

Hereinafter, the present invention will be described with reference to the drawings based on a preferred embodiment. In the embodiment, a comparative example, and modification examples, the same reference numerals are assigned to the same or equivalent components and members, and redundant descriptions thereof are appropriately omitted. For easy understanding, dimensions of the members in each drawing are appropriately enlarged or reduced. In each drawing, some of the members not important for explaining the embodiment are omitted. Terms including first, second, or the like are used to describe various components. However, the terms are used only for distinguishing one component from another component, and the component is not limited by the term.

FIG. 1 is a view schematically showing an ion implanter 100 including an insulating structure 30 according to an embodiment of the present invention. The ion implanter 100 is configured to perform ion implantation processing on a surface of a workpiece W. For example, the workpiece W is a substrate such as a wafer. Accordingly, hereinafter, for convenience of description explanation, the workpiece W may be referred to as a substrate W. However, it is not intended to limit an object to be implanted to a specific object.

The ion implanter 100 includes an ion source unit 102, a beamline unit 104, and an implantation processing chamber 106. The ion implanter 100 is configured to irradiate the entire substrate W with an ion beam B by at least one of a beam scan and a mechanical scan.

The ion source unit 102 is configured to supply the ion beam B to the beamline unit 104. The ion source unit 102 includes an ion source 112 and an extraction electrode section 114 for extracting the ion beam B from the ion source 112. The ion source unit 102 also includes an electrode driving mechanism 115 for adjusting a position and/or an orientation of the extraction electrode section 114 with respect to the ion source 112. The ion source unit 102 will be described later.

The beamline unit 104 is configured to transport the ion beam from the ion source unit 102 to the implantation processing chamber 106. A mass analyzer 108 is disposed on a downstream side of the ion source unit 102, and the mass analyzer 108 is configured to sort out required ions from the ion beam B.

For example, the beamline unit 104 performs operations including deflection, acceleration, deceleration, shaping, scanning, and the like for the ion beam B which has passed through the mass analyzer 108. The beamline unit 104 may include a beam scan unit 110, a parallelizing lens (hereinafter, referred to as a P lens) 104b, acceleration/deceleration electrodes 104d, and an angular energy filter 104f. The beam scan unit 110 applies at least one of an electric field and a magnetic field to the ion beam B to scan the ion beam B.

The P lens 104b includes a lens electrode 104c, applies an electric field to the ion beam B by applying a high voltage to the lens electrode 104c, and parallelizes the ion beam B scanned by the beam scan unit 110. The acceleration/deceleration electrodes 104d accelerate or decelerate the ion beam B to forward the ion beam B to the angular energy filter 104f. The angular energy filter 104f includes deflecting electrodes 104g, applies an electric field to the ion beam B by applying a high voltage to the deflecting electrodes 104g to deflect the ion beam B, and as a result, the substrate W is irradiated with only ions having predetermined energy. In this manner, the beamline unit 104 supplies the ion beam B with which the substrate W is to be irradiated to the implantation processing chamber 106. For easy understanding, in FIG. 1, dimensions of each member are shown differently from the actual ratio. This is similarly applied to other drawings.

The implantation processing chamber 106 includes an object holder 107 which holds one substrate W or a plurality of substrates W. The object holder 107 is configured to provide the mechanical scan which is a relative movement with respect to the ion beam B to the substrate W if necessary.

The ion implanter 100 includes a vacuum exhaust system (not shown) for providing a desired vacuum environment to the ion source unit 102, the beamline unit 104, and the implantation processing chamber 106.

Ion Source Unit

Figure 2:
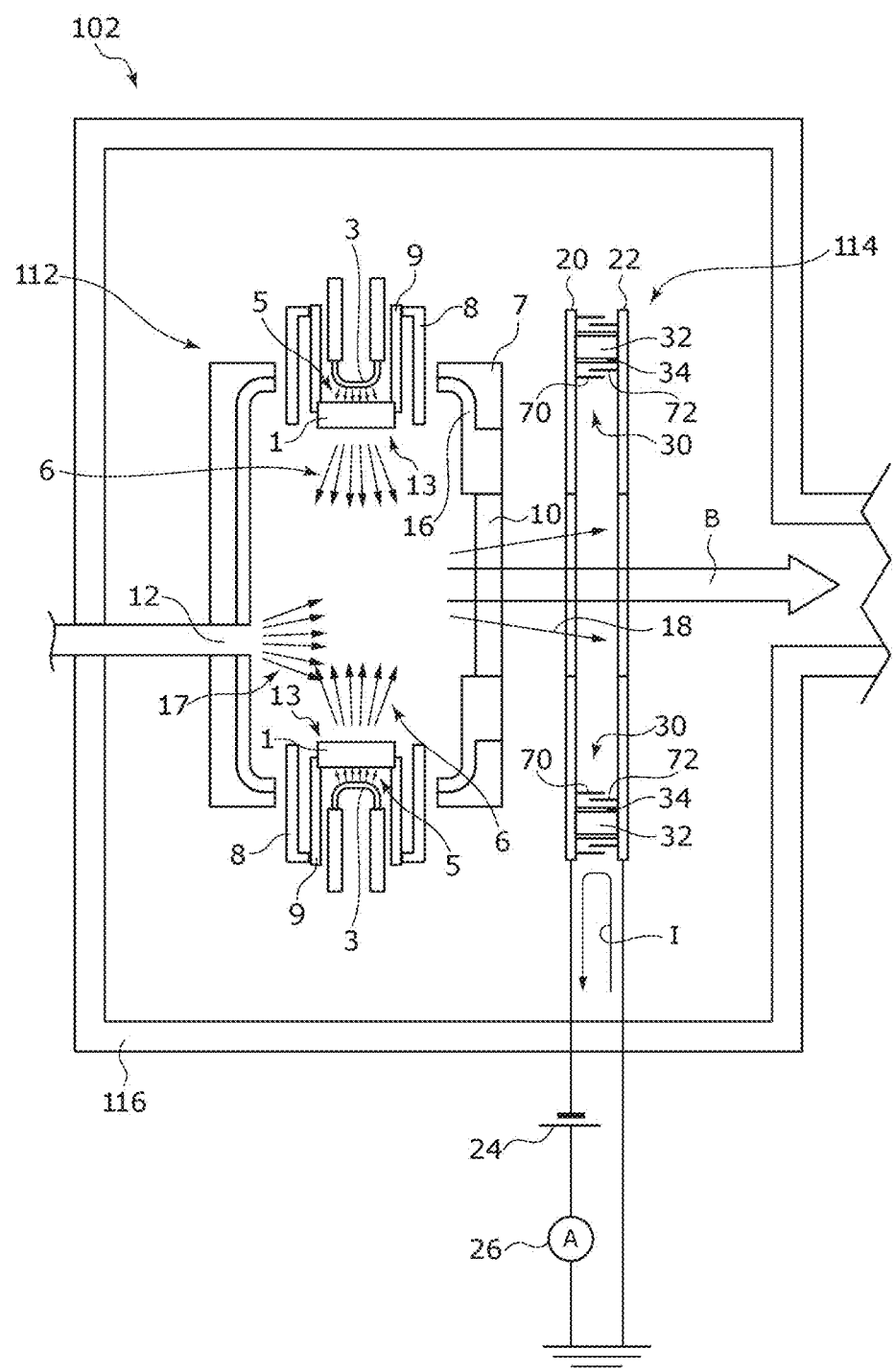
FIG. 2 is a view schematically showing an ion source unit according to the embodiment of the present invention.

FIG. 2 is a view schematically showing the ion source unit 102 including the insulating structure 30. The ion source unit 102 includes an ion source vacuum chamber 116 for accommodating the ion source 112 and the extraction electrode section 114. The ion source 112 shown in the drawings is an ion source with an indirectly heated cathode. However, the ion source to which the present invention is applicable is not limited to this specific ion source with the indirectly heated cathode.

Two cathodes 13 are provided in an arc chamber 7 which is a plasma generating unit. One cathode 13 is disposed on the upper portion of the arc chamber 7 while the other cathode 13 is disposed on the lower portion of the arc chamber 7. Each cathode 13 includes a cathode cap 1 and a filament 3. Pair of the cathode caps 1 and the filaments 3 are symmetrically disposed in a direction of a magnetic field of the arc chamber 7. The cathode cap 1 is supported by a thermal break 9. A cathode repeller 8 is provided around the thermal break 9. A gas inlet 12 is provided on one side of the arc chamber 7, and an extraction opening 10 is formed on the other side facing the gas inlet 12.

A liner 16 which is an inner wall of the plasma generating unit is provided in the arc chamber 7. For example, the liner 16 is formed of a carbon material such as graphite, glass-like carbon, or the like. The entire (or at least partial) portion of an inner surface of the arc chamber 7 is covered with the liner 16. This can reduce metal contamination in the ion beam. The liner 16 is divided into several parts and is formed to conform to a shape of the inner surface of the arc chamber 7 and is mounted as the inner wall of the arc chamber 7 by fitting.

The ion source 112 includes an extraction power supply (not shown) configured to apply an extraction voltage to the arc chamber 7. The ion source 112 includes a filament power supply (not shown) for the filament 3 and a cathode power supply (not shown) for the cathode 13.

Extraction Electrode Section

The extraction electrode section 114 includes a plurality of electrodes including a first electrode 20 as a suppression electrode and a second electrode 22 as a ground electrode. For example, the first electrode 20 and the second electrode 22 are formed of stainless steel, graphite, molybdenum, or tungsten. As shown in the drawings, the first electrode 20 and the second electrode 22 are respectively provided with openings corresponding to the extraction opening 10 to cause the ion beam B to pass therethrough. For example, each of the openings has a vertically elongated hole shape.

The first electrode 20 is connected to a suppression power supply 24. The suppression power supply 24 is provided to apply a negative potential of approximately −0.5 to −5 kV to the first electrode 20 with respect to the second electrode 22. The first electrode 20 is connected with a ground potential via the suppression power supply 24, and a suppression ammeter 26 is provided on a current path from the first electrode 20 to the ground potential. The second electrode 22 is connected with the ground potential.

The suppression ammeter 26 is provided to monitor a suppression current I which is a flow of electrons between the first electrode 20 and the ground potential. The suppression current I includes a current which leaks by insulating performance deterioration due to contamination particles being deposited on the surface of the insulating portion. Accordingly, when the ion beam B is extracted normally, the suppression current I is sufficiently low. A predetermined limit value (for example, 15 mA) is set for the suppression current I, and if the suppression current I exceeding the predetermined limit value is detected, an operation of the ion source 112 is stopped. In this case, for example, application of the high voltages to the arc chamber 7 and the extraction electrode section 114 are stopped, and maintenance of the device is performed.

Figure 3:
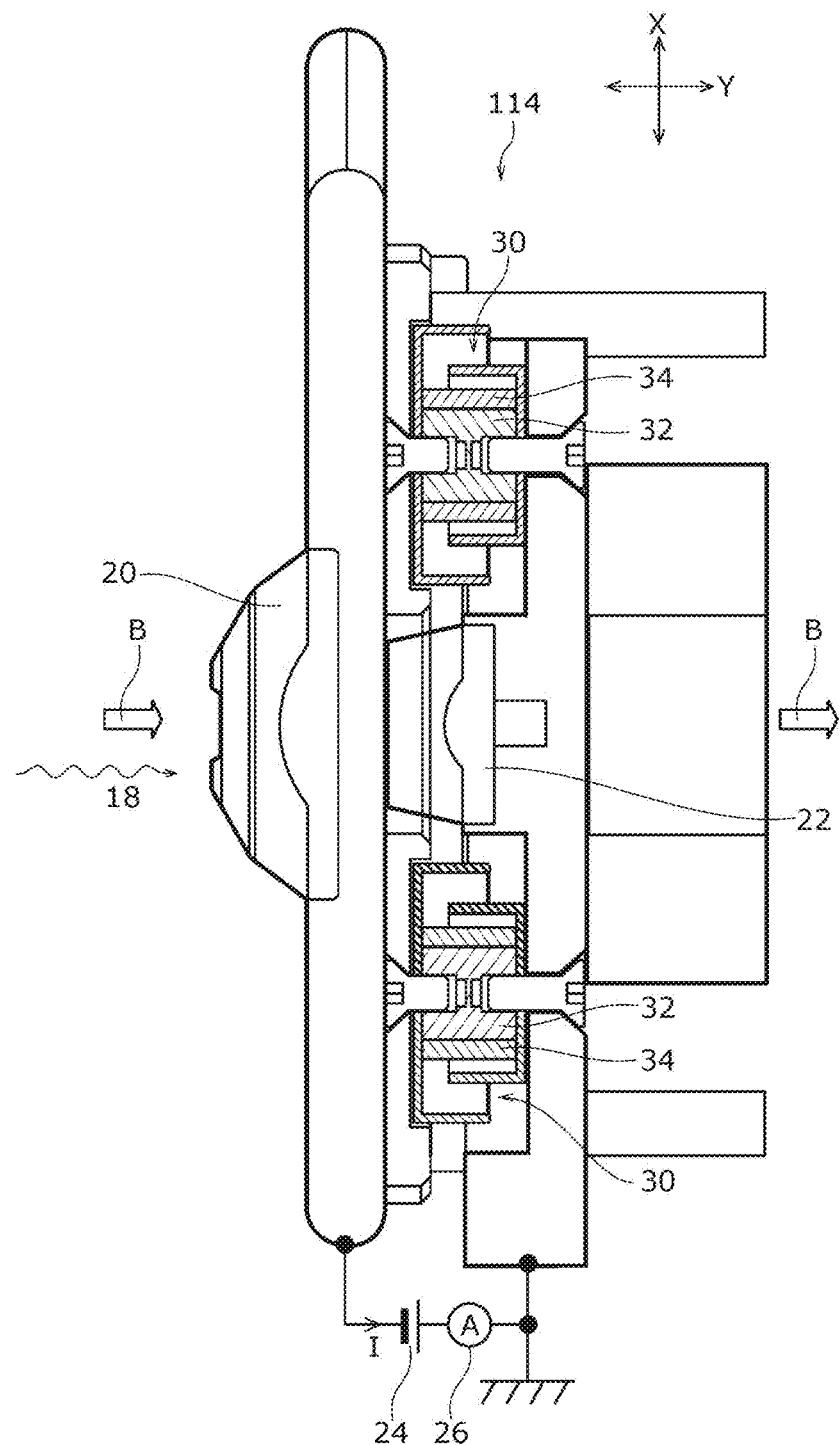
FIG. 3 is a sectional view schematically showing an extraction electrode section according to the embodiment of the present invention.
Figure 4:
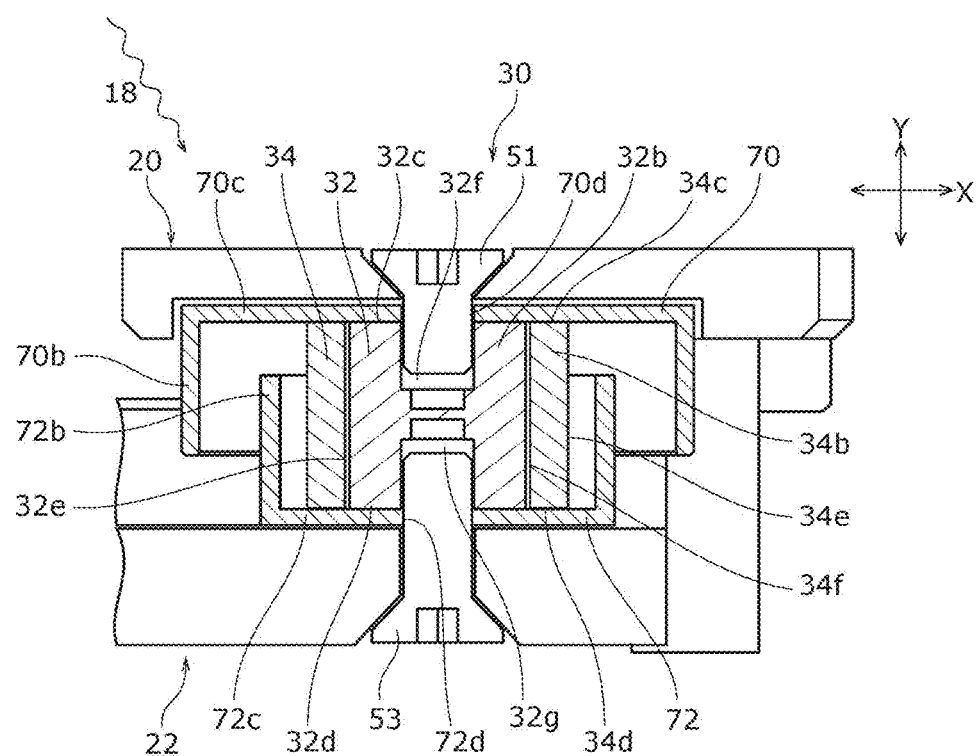
FIG. 4 is a sectional view schematically showing an insulating structure according to the embodiment of the present invention.

FIG. 3 is a sectional view schematically showing the extraction electrode section 114 according to the embodiment of the present invention. Insulating structures 30 for insulation between the first electrode 20 and the second electrode 22 are provided between the first electrode 20 and the second electrode 22. As shown in FIG. 3, a plurality of (for example, four) insulating structures 30 may be disposed in a circumferential direction to surround a traveling path of the ion beam B. FIG. 4 is a sectional view schematically showing an insulating structure 30 according to the embodiment of the present invention.

Insulating Structure

The insulating structure 30 includes a first insulating member 32, a second insulating member 34, and protection members 70 and 72. The second insulating member 34 is an insulating member for decreasing deposition of contamination particles 18 to the first insulating member 32 and is fitted to the first insulating member 32. Each of the protection members 70 and 72 is a member for protecting the second insulating member 34 from the contamination particles 18. For example, each of the protection members 70 and 72 is a cover member which covers at least a portion of the second insulating member 34. The protection members 70 and 72 will be described later.

First Insulating Member

The first insulating member 32 is an insulating member which is provided to support the first electrode 20 with respect to the second electrode 22. The first insulating member 32 is disposed between the first electrode 20 and the second electrode 22, and insulates the first electrode 20 and the second electrode 22 from each other and mechanically connects the first electrode 20 and the second electrode 22 to each other. Preferably, the first insulating member 32 has mechanical strength enough to support the first electrode 20 and the second electrode 22. Preferably, the first insulating member 32 is formed of a material having the mechanical strength which is higher than that of the second insulating member 34. For example, the first insulating member 32 is formed of a high-strength ceramic such as alumina, silica, zirconia, aluminum nitride, silicon nitride, or steatite. The material forming the first insulating member 32 may be a mixture of a plurality of materials or a composite material thereof.

The first insulating member 32 can be formed in various shapes. For example, the first insulating member 32 of the present embodiment includes a cylindrical portion 32b which is cylindrically formed. The cylindrical portion 32b of the first insulating member 32 includes a cylindrical outer peripheral surface 32e, end surfaces 32c and 32d which are provided on both end portions of the outer peripheral surface 32e, and recessed portions 32f and 32g which are recessed in the axial direction from the end surfaces 32c and 32d. The first electrode 20 is fixed to the end surface 32c of the first insulating member 32 in a state where the protection member 70 is interposed between the first electrode 20 and the end surface 32c. A fastening member 51 penetrates the first electrode 20 and the protection member 70 and is fastened to the recessed portion 32f. The second electrode 22 is fixed to the end surface 32d of the first insulating member 32 in a state where the protection member 72 is interposed between the second electrode 22 and the end surface 32d. A fastening member 53 penetrates the second electrode 22 and the protection member 72 and is fastened to the recessed portion 32g. According to this configuration, the first electrode 20 is supported by the second electrode 22.

Second Insulating Member

The second insulating member 34 is an insulating member which is fitted to the first insulating member 32 for decreasing deposition of the contamination particles 18 to the first insulating member 32. The second insulating member 34 may be formed of a material having the mechanical strength which is lower than that of the first insulating member 32. The second insulating member 34 may be formed of a material with less deposition of the contamination particles 18 than the first insulating member 32. Preferably, compared to the first insulating member 32, the second insulating member 34 is formed of a material on which the contamination particles 18 are easily removed by the minute discharge and a conductive path is not easily formed. The second insulating member 34 may be formed of a material having the hardness lower than that of the first insulating member 32. Preferably, the second insulating member 34 is more brittle than the first insulating member 32. For example, a Vickers hardness of an outer surface of the second insulating member 34 maybe 5 GPa or less. For example, bending strength of the second insulating member 34 may be 100 MPa or less.

For example, the second insulating member 34 is formed of a material including at least one of boron nitride, a porous ceramic, and a resin. For example, the porous ceramic includes porous alumina, porous silica glass, porous zirconia or the like. As the resin forming the second insulating member 34, it is desirable to withstand a high temperature of 150° C. or higher, and for example, a fluororesin or the like can be used. The second insulating member 34 of the present embodiment is formed of boron nitride.

A shape of the second insulating member 34 is not particularly limited as long as it can be fitted to the first insulating member 32. The second insulating member 34 may include a tubular portion which annularly surrounds at least a portion of the first insulating member 32. For example, the second insulating member 34 of the embodiment is formed in a hollow cylindrical shape. The second insulating member 34 includes a hollow tubular portion 34b. The tubular portion 34b includes end surfaces 34c and 34d which are provided on both ends of the tubular portion 34b, an outer peripheral surface 34e, and an inner peripheral surface 34f. The tubular portion 34b annularly surrounds the outer peripheral surface 32e of the cylindrical portion 32b of the first insulating member 32.

If a clearance gap between the inner peripheral surface 34f of the tubular portion 34b and the outer peripheral surface 32e of the first insulating member 32 is too large, there is concern that the contamination particles 18 enter the clearance gap and the insulation performance of the first insulating member 32 deteriorates. Accordingly, a radial clearance gap between the inner peripheral surface 34f and the outer peripheral surface 32e may be 1 mm or less. In this case, it is possible to decrease the entering of the contamination particles 18 to the clearance gap. If the clearance gap between the inner peripheral surface 34f and the outer peripheral surface 32e is too small, the clearance gap is narrowed by a thermal expansion, and thus, there is a concern that unnecessary stress is applied to the first insulating member 32 and the second insulating member 34. Accordingly, it is preferable that the radial clearance gap between the inner peripheral surface 34f and the outer peripheral surface 32e is set as small as possible within a range which can absorb shape change due to the thermal expansion in an operating temperature range. In the embodiment, the second insulating member 34 is fitted to the first insulating member 32 with play. For example, the play between the first insulating member 32 and the second insulating member 34 may be 0.2 mm or more.

In the second insulating member 34, the end surface 34c abuts on the protection member 70 and the end surface 34d abuts on the protection member 72. That is, the second insulating member 34 is supported in a state of being interposed between the first electrode 20 and the second electrode 22 via the protection members 70 and 72. An axial length from the end surface 34c to the end surface 34d of the second insulating member 34 is set to be slightly smaller than an axial length from the end surface 32c to the end surface 32d of the first insulating member 32.

Protection Member

Each of the protection members 70 and 72 is a cover member for protecting at least a portion of the second insulating member 34 from the contamination particles 18. The protection member 70 surrounds a portion of the second insulating member 34 close to the first electrode 20 and is supported by the first electrode 20. The protection member 72 surrounds a portion of the second insulating member 34 close to the second electrode 22 and is supported by the second electrode 22. The protection member 70 and the protection member 72 are formed of a material having conductivity (for example, stainless steel, graphite, molybdenum, or tungsten).

A shape of the protection member 70 is not particularly limited as long as it can annularly surround the second insulating member 34. In the embodiment, the protection member 70 is an approximately cup-shaped member including a cylindrical portion 70b which surrounds the second insulating member 34 and a disk portion 70c which extends inward in a radial direction from the cylindrical portion 70b. A through hole 70d through which the fastening member 51 passes is provided in the vicinity of the center of the disk portion 70c. The disk portion 70c is interposed between the end surface 32c of the first insulating member 32 and the first electrode 20 to be fixed.

A shape of the protection member 72 is not particularly limited as long as it can annularly surround the second insulating member 34. In the embodiment, the protection member 72 is an approximately cup-shaped member including a cylindrical portion 72b which surrounds the second insulating member 34 and a disk portion 72c which extends inward in the radial direction from the cylindrical portion 72b. A through hole 72d through which the fastening member 53 passes is provided in the vicinity of the center of the disk portion 72c. The disk portion 72c is interposed between the end surface 32d of the first insulating member 32 and the second electrode 20 to be fixed. The cylindrical portion 72b of the protection member 72 includes a portion which annularly surrounds the second insulating member 34 via a clearance gap, and the cylindrical portion 70b of the protection member 70 includes a portion which annularly surrounds the cylindrical portion 72b via another clearance gap. That is, the cylindrical portion 72b is formed to have a radius which is smaller than that of the cylindrical portion 70b.

Figure 5:
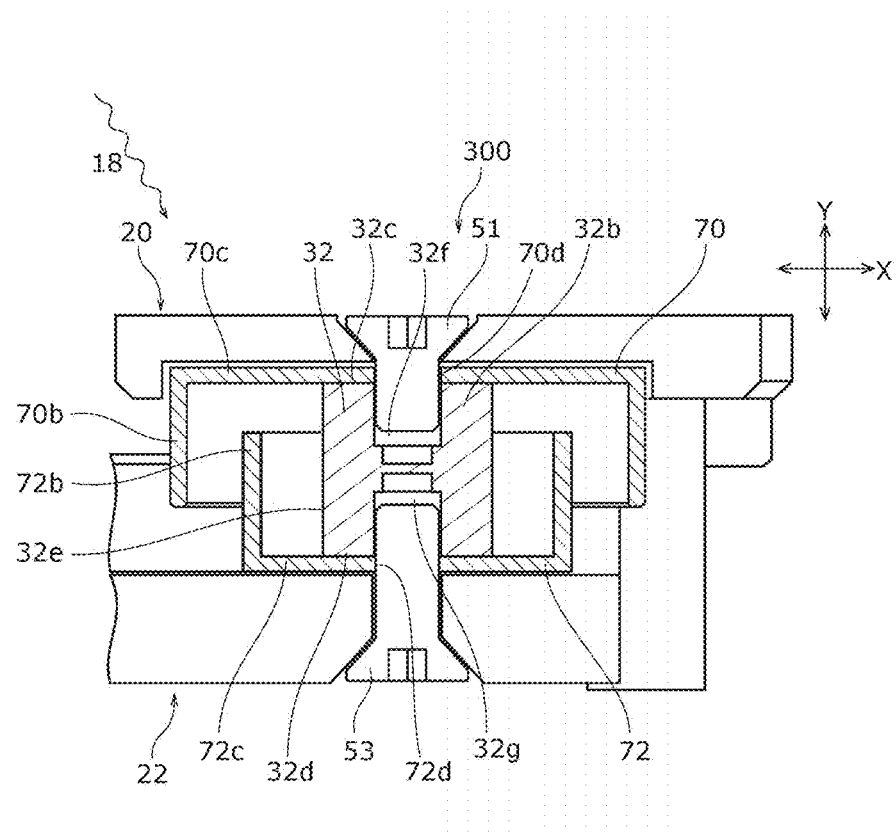
FIG. 5 is a sectional view schematically showing an insulating structure according to a comparative example.
Figure 6:
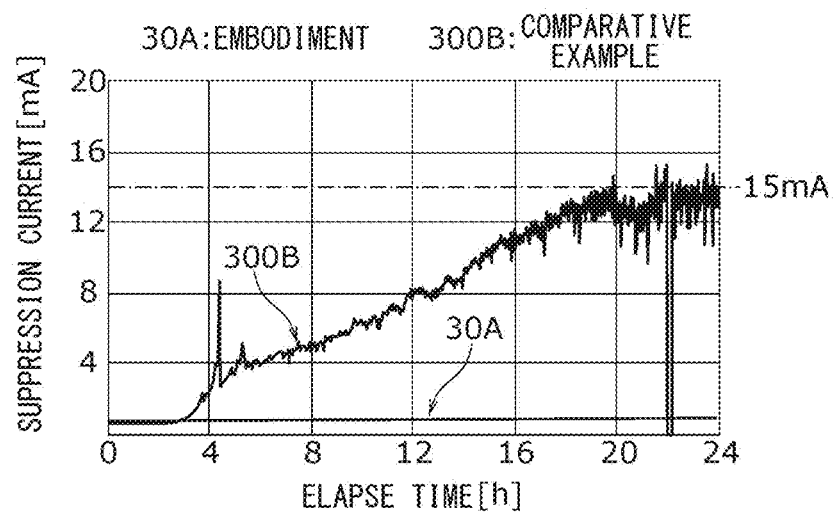
FIG. 6 is a graph showing suppression currents in the embodiment of the present invention and a comparative example.

Next, an example of the suppression current I of the insulating structure 30 according to the embodiment will be described. Here, it will be described by comparison with an insulating structure 300 of a comparative example. FIG. 5 is a sectional view schematically showing the insulating structure 300 according to the comparative example and corresponds to FIG. 4. The insulating structure 300 is different from the insulating structure 30 in that the second insulating member 34 is not provided, and the other configurations of the insulating structure 300 are similar to those of the insulating structure 30. FIG. 6 is a graph showing suppression currents I of the insulating structure 30 according to the present embodiment and the insulating structure 300 according to the comparative example. In FIG. 6, a horizontal axis indicates an elapse time after the operation of the ion implanter 100 starts and a vertical axis indicates the suppression current I. In FIG. 6, a graph 30A shows a change of the suppression current I for the insulating structure 30 according to the present embodiment, and a graph 300B shows a change of the suppression current I for the insulating structure 300 according to the comparative example.

In the comparative example in which the second insulating member 34 is not provided, as shown by the graph 300B, the suppression current gradually increases with a passage of time from the start of the operation and exceeds a limit value of 15 mA between 20 hours and 24 hours of the operation time. Accordingly, in the comparative example, the ion implanter 100 stops between 20 hours and 24 hours of the operation time, and the maintenance of the device may be performed. For the insulating structure 30 provided with the second insulating member 34, as shown in the graph 30A, the suppression current I is almost unchanged at approximately 1 mA, and in a continuous operation for 7 days, the suppression current I does not exceed the limit value of 15 mA. Therefore, in the insulating structure 30 according to the present embodiment, it is possible to decrease frequency of the maintenance of the device.

Operations and effects of the insulating structure 30 configured as described above will be described.

The insulating structure 30 according to the present embodiment insulates the electrode provided inside the vacuum region of the ion implanter from another member and support the electrode, and the insulating structure 30 includes the first insulating member 32 which supports the first electrode 20, and a second insulating member 34 which is fitted to the first insulating member 32 to suppress deposition of contamination particles on the first insulating member 32. The second insulating member 34 is formed of a material having a hardness lower than that of the first insulating member 32. The first insulating member 32 is covered with the second insulating member 34, and thus, it is possible to suppress the deposition of the contamination particles 18. The second insulating member 34 is formed of a material having a low hardness, the deposited contamination particles 18 are easily removed by the minute discharge, and even when the contamination particles 18 are deposited, a deterioration in the insulation performance is suppressed. The first insulating member 32 is formed of a material having a superior mechanical strength, and thus, the first electrode 20 is firmly supported. In addition, it is possible to reduce the amount of the material used for the second insulating member 34 and suppress a cost increase. It is possible to suppress a deterioration in the insulation performance caused by not only contamination particles generated directly from the carbon material but also contamination particles secondarily released by sputtering of the wall surface or contamination particles generated by a chemical reaction. Accordingly, it is possible to maintain the insulation performance of the electrode for a long time while securing the mechanical strength for supporting the electrode, the frequency of the maintenance is decreased, and thus, an operation availability and productivity can be improved.

In the insulating structure 30 according to the present embodiment, the Vickers hardness of the outer surface of the second insulating member 34 is 5 GPa or less. According to this configuration, compared to a case where the Vickers hardness of the outer surface of the second insulating member 34 exceeds 5 GPa, the contamination particles 18 are easily removed by the minute discharge, and even when the contamination particles 18 are deposited, a deterioration in the insulation performance can be suppressed.

In the insulating structure 30 according to the embodiment, the bending strength of the second insulating member 34 is 100 MPa or less. According to this configuration, compared to a case where the bending strength of the second insulating member 34 exceeds 100 MPa, the contamination particles 18 are easily removed by the minute discharge, and even when the contamination particles 18 are deposited, a deterioration in the insulation performance can be suppressed.

In the insulating structure 30 according to the embodiment, the second insulating member 34 is formed of a material including at least one of boron nitride, a porous ceramic, and a resin. According to this configuration, the hardness of the outer surface of the second insulating member 34 can be softened, the contamination particles 18 are easily removed by the minute discharge, and even when the contamination particles 18 are deposited, a deterioration in the insulation performance can be suppressed.

In the insulating structure 30 according to the embodiment, the second insulating member 34 includes the tubular portion which annularly surrounds at least a portion of the first insulating member 32, and the clearance gap between the tubular portion and the first insulating member 32 is 1 mm or less. According to this configuration, compared to a case where the clearance gap between the second insulating member 34 and the first insulating member 32 exceeds 1 mm, it is possible to reduce the entering of the contamination particles 18 into the clearance gap.

In the insulating structure 30 according to the embodiment, the second insulating member 34 is fitted to the first insulating member 32 with play. According to this configuration, compared to a case where the play is not provided, it is possible to easily absorb influences of the shape change caused by the thermal expansion.

In the insulating structure 30 according to the embodiment, the play is 0.2 mm or more. According to this configuration, compared to a case where the play is less than 0.2 mm, it is possible to more easily absorb the influences of the shape change caused by the thermal expansion.

In the insulating structure 30 according to the embodiment, the insulating structure 30 includes the protection members 70 and 72 which annularly surround at least a portion of the second insulating member 34 to protect the second insulating member 34 from the contamination particles. According to this configuration, compared to a case where the protection members 70 and 72 are not provided, it is possible to decrease the contamination particles flying to the second insulating member 34 and to further suppress the deterioration in the insulation performance.

In the insulating structure 30 according to the embodiment, the first insulating member 32 and the second insulating member 34 are provided between the first electrode 20 and the second electrode 22 which are the plurality of electrodes for extracting the ion beam from the plasma generating unit. According to this configuration, the first electrode 20 and the second electrode 22 are firmly connected to each other by the first insulating member 32 having the superior mechanical strength, the contamination particles deposited on the second insulating member 34 are removed by the minute discharge, and thus, it is possible to maintain the insulation performance between the first electrode 20 and the second electrode 22 for a long period of operation time.

It should be understood that the invention is not limited to the above-described embodiment, but may be modified into various forms on the basis of the spirit of the invention. Additionally, the modifications are included in the scope of the invention.

Hereinafter, modification examples will be described. In the drawings and descriptions of the modification examples, the same numeral references are assigned to the same components and members equivalent to those of the embodiment. Descriptions redundant with respect to the embodiment are appropriately omitted and configurations different from those of the embodiment are mainly described.

First Modification Example

Figure 7:
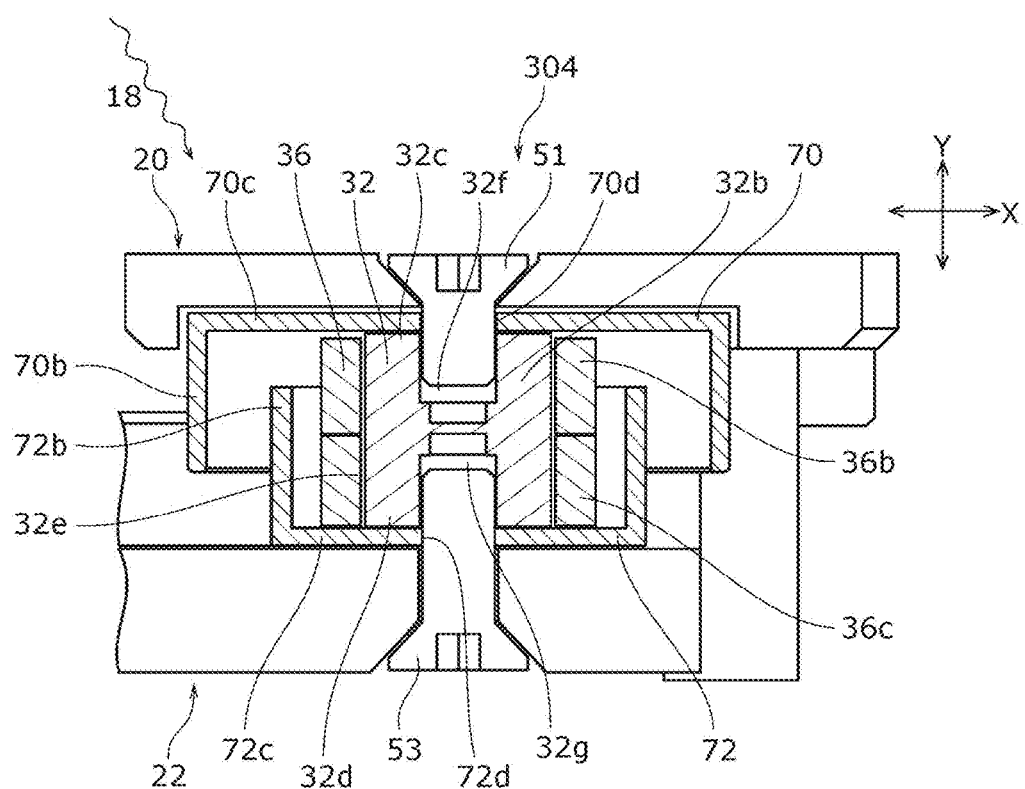
FIG. 7 is a sectional view schematically showing an insulating structure according to a first modification example.

In the embodiment, the example in which the second insulating member 34 is formed to be integrated in the axial direction is described. However, the present invention is not limited to this configuration. The second insulating member may include a plurality of portions which can be separated from each other, and the plurality of portions maybe fitted to different positions of the first insulating member 32. That is, the second insulating member can be configured of a plurality of pieces. FIG. 7 is a sectional view schematically showing an insulating structure 304 according to a first modification example and corresponds to FIG. 4. The insulating structure 304 includes a second insulating member 36 instead of the second insulating member 34. The second insulating member 36 is divided into two portions 36b and 36c in the axial direction and each of the portions 36b and 36c is fitted to the first insulating member 32.

There is no mechanical restriction between the portion 36b and the portion 36c. So, the portion 36b and the portion 36c are slightly movable each other. The insulating structure 304 according to the first modification example has effects similar to those of the insulating structure 30 according to the embodiment.

Second Modification Example

In the embodiment, the example in which the insulating structure according to the present invention is applied to a site between the two electrodes of the extraction electrode section 114 is described. However, the present invention is not limited to this configuration. The insulating structure according to the present invention can be applied as an insulating structure which insulates an electrode provided inside the vacuum region of the ion implanter from another member and supports the electrode. Particularly, the insulating structure according to the present invention can be applied as an insulating structure which insulates the electrode from a wall portion surrounding a vacuum environment and supports the electrode.

Figure 8:
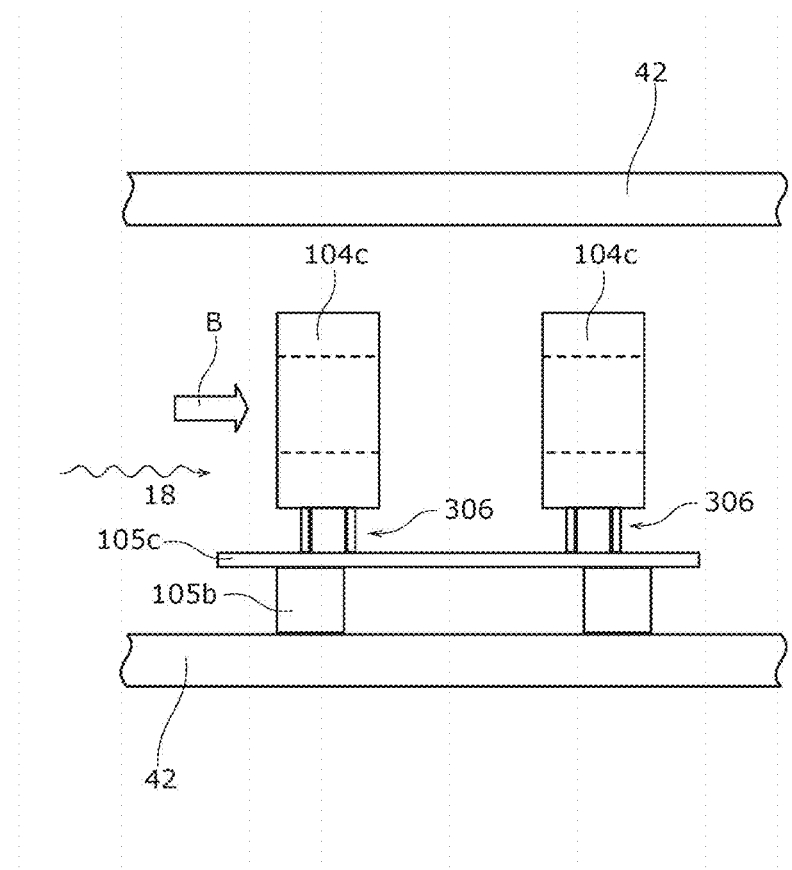
FIG. 8 is a view schematically showing the vicinity of a lens electrode of a P lens to which an insulating structure according to a second modification example is applied.
Figure 9:
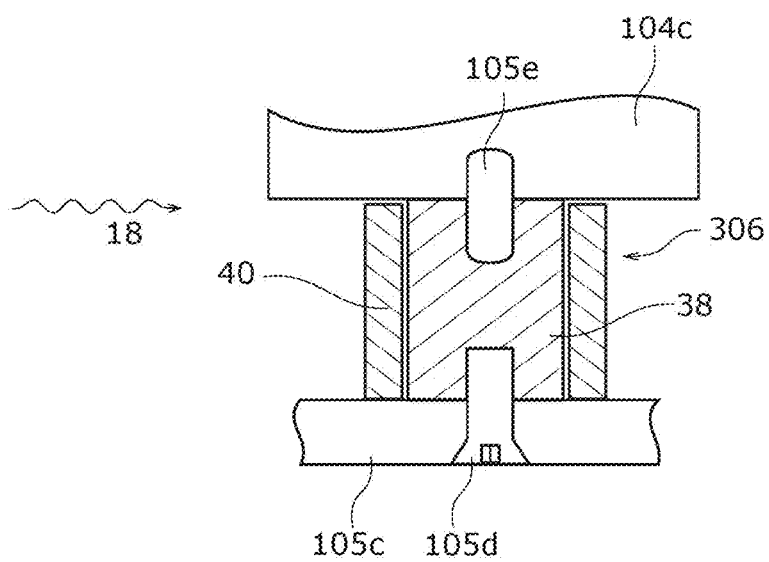
FIG. 9 is a sectional view schematically showing the insulating structure according to the second modification example.

For example, the insulating structure according to the present invention can be applied to some or all of the lens electrodes 104c of the P lens 104b, the acceleration/deceleration electrode 104d, and the deflecting electrodes 104g of the angular energy filter 104f. As an example, an insulating structure 306 according to a second modification example in which the insulating structure according to the present invention is applied to the lens electrodes 104c of the P lens will be described. FIG. 8 is a view schematically showing the vicinity of the lens electrodes 104c of the P lens to which the insulating structure 306 according to the second modification example is applied. FIG. 9 is a sectional view schematically showing the insulating structure 306 according to the second modification example.

The lens electrodes 104c of the P lens are disposed on a platform 105c which is provided on a wall portion 42 surrounding a vacuum environment of the beamline unit 104 via a rail 105b. The insulating structure 306 insulates the lens electrodes 104c provided inside the vacuum region of the ion implanter from the platform 105c and supports the lens electrodes 104c. The insulating structure 306 includes a first insulating member 38 which supports the lens electrode 104c and a second insulating member 40 which is fitted to the first insulating member 38 in order to decrease the deposition of the contamination particles 18 to the first insulating member 38. The first insulating member 38 is fixed to the platform 105c by a fastening member 105d. For example, the fastening member 105d may penetrate the platform 105c and be connected to a recessed portion which is provided in the vicinity of the center of the first insulating member 38. The first insulating member 38 is fixed to the lens electrode 104c by the fastening member 105e. For example, the fastening member 105e may be connected to each of the recessed portions which are respectively provided in the lens electrode 104c and the first insulating member 38. The first insulating member 38 has an approximately cylindrical shape and includes a configuration and characteristics similar to those of the above-described first insulating member 32. The second insulating member 40 has an approximately hollow cylindrical shape and includes a configuration and characteristics similar to those of the above-described second insulating member 34. The insulating structure according to the second modification example has effects similar to those of the insulating structure 30 according to the embodiment.

Third Modification Example

In the embodiment, the example in which the second insulating member 34 is formed in an annular shape. However, the present invention is not limited to this configuration. For example, in the second insulating member 34, a portion in the circumferential direction may be cut out, and in this case, the cutout portion maybe disposed on a side opposite to a direction from which the contamination particles come flying. The insulating structure according to the third modification example has effects similar to those of the insulating structure 30 according to the embodiment.

In the drawings used for the descriptions, cross sections of some of members are hatched in order to clarify a relationship between the members. However, the hatching does not limit materials of these members.

What is claimed is:

1. An insulating structure which insulates an electrode provided inside a vacuum region of an ion implanter from another member and supports the electrode, comprising:
    a first insulating member which supports the electrode; and
    a second insulating member which is fitted to the first insulating member to suppress deposition of contamination particles on the first insulating member,
    wherein the second insulating member is formed of a material having a hardness lower than that of the first insulating member,
    wherein the second insulating member includes a tubular portion which annularly surrounds at least a portion of the first insulating member, and
    wherein a clearance gap between the tubular portion and the first insulating member is 1 mm or less.

2. The insulating structure according to claim 1, wherein a Vickers hardness of an outer surface of the second insulating member is 5 GPa or less.

3. The insulating structure according to claim 1, wherein bending strength of the second insulating member is 100 MPa or less.

4. The insulating structure according to claim 1, wherein the second insulating member is formed of a material including at least one of boron nitride, a porous ceramic, and a resin.

5. An insulating structure which insulates an electrode provided inside a vacuum region of an ion implanter from another member and supports the electrode, comprising:
- a first insulating member which supports the electrode; and
- a second insulating member which is fitted to the first insulating member to suppress deposition of contamination particles on the first insulating member,
- wherein the second insulating member is formed of a material having a hardness lower than that of the first insulating member,
- wherein the second insulating member is fitted to the first insulating member with play.

6. The insulating structure according to claim 5, wherein the play is 0.2 mm or more.

7. The insulating structure according to claim 1,
- wherein the second insulating member includes a plurality of portions which can be separated from each other, and
- wherein the plurality of portions are fitted to different positions of the first insulating member.

8. The insulating structure according to claim 1, further comprising:
- a protection member which annularly surrounds at least a portion of the second insulating member to protect the second insulating member from the contamination particles.

9. The insulating structure according to claim 1,
- wherein the first insulating member and the second insulating member are provided between the plurality of electrodes for extracting an ion beam from a plasma generating unit.

10. The insulating structure according to claim 5,
- wherein a Vickers hardness of an outer surface of the second insulating member is 5 GPa or less.

11. The insulating structure according to claim 5,
- wherein bending strength of the second insulating member is 100 MPa or less.

12. The insulating structure according to claim 5,
- wherein the second insulating member is formed of a material including at least one of boron nitride, a porous ceramic, and a resin.

13. The insulating structure according to claim 5,
- wherein the second insulating member includes a tubular portion which annularly surrounds at least a portion of the first insulating member, and
- wherein a clearance gap between the tubular portion and the first insulating member is 1 mm or less.

14. The insulating structure according to claim 5,
- wherein the second insulating member includes a plurality of portions which can be separated from each other, and
- wherein the plurality of portions are fitted to different positions of the first insulating member.

15. The insulating structure according to claim 5, further comprising:
- a protection member which annularly surrounds at least a portion of the second insulating member to protect the second insulating member from the contamination particles.

16. The insulating structure according to claim 5,
- wherein the first insulating member and the second insulating member are provided between the plurality of electrodes for extracting an ion beam from a plasma generating unit.

* * * * *